United States Patent
Wei

(10) Patent No.: US 8,638,554 B2
(45) Date of Patent: Jan. 28, 2014

(54) AIR DUCT AND ELECTRONIC DEVICE HAVING THE SAME

(75) Inventor: Chao-Ke Wei, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 443 days.

(21) Appl. No.: 13/154,455

(22) Filed: Jun. 7, 2011

(65) Prior Publication Data

US 2012/0155021 A1   Jun. 21, 2012

(30) Foreign Application Priority Data

Dec. 20, 2010   (TW) .............................. 99144749 A

(51) Int. Cl.
*H05K 7/20* (2006.01)
*F28F 7/00* (2006.01)

(52) U.S. Cl.
USPC ..................... 361/679.49; 361/697; 165/80.3; 174/16.3

(58) Field of Classification Search
USPC ....................... 361/679.46–679.54, 688–723; 165/80.2–80.5, 104.33, 185; 257/712–715, 718–722; 174/15.1–15.2, 16.1, 16.3, 548; 454/184

See application file for complete search history.

(56) References Cited

U.S. PATENT DOCUMENTS

| | | | |
|---|---|---|---|
| 7,256,993 B2 * | 8/2007 | Cravens et al. ............... | 361/690 |
| 7,262,964 B1 * | 8/2007 | Barsun .......................... | 361/695 |
| 7,432,441 B2 * | 10/2008 | Liang .............................. | 174/50 |
| 7,646,601 B2 * | 1/2010 | Zhang et al. .................. | 361/695 |
| 8,149,578 B2 * | 4/2012 | Neumann et al. ............. | 361/690 |
| 8,353,746 B2 * | 1/2013 | Tsai et al. ..................... | 454/284 |
| 8,411,437 B2 * | 4/2013 | Shu ............................... | 361/695 |
| 2013/0050951 A1 * | 2/2013 | Zhou ............................. | 361/720 |
| 2013/0163199 A1 * | 6/2013 | Chen ............................. | 361/690 |

* cited by examiner

*Primary Examiner* — Zachary M Pape
(74) *Attorney, Agent, or Firm* — Altis Law Group, Inc.

(57) ABSTRACT

An air duct includes a top plate, two side plates extending from two lateral sides of the top plate, a baffle plate extending from the top plate and located between the side plates, and a torsion spring connected between the top plate and the baffle plate. The top plate and the side plates cooperatively define an air passage in the air duct. The baffle plate includes a first end pivotally connected with the top plate and an opposite second end. The second end of the baffle plate is rotatable relative to the top plate. The torsion spring includes two arms abutting against the top plate and the baffle plate, respectively. When the baffle plate is rotated relative to the top plate under an external force, the torsion spring resists such force.

8 Claims, 7 Drawing Sheets

AIR DUCT AND ELECTRONIC DEVICE HAVING THE SAME

BACKGROUND

1. Technical Field

The disclosure generally relates to electronic devices, and particularly to an electronic device having an air duct for guiding airflow to cool electronic components inside the electronic device.

2. Description of Related Art

As electronic devices such as computers and servers continue to develop, some computers or servers have more than one Central Processing Unit (CPU) to achieve more tasks quicker. The CPUs generate a large amount of heat during operation, and the heat must be dissipated immediately.

A typical heat dissipation device for dissipating heat from the CPUs includes a fan and a fan duct attached to the fan. The fan duct includes an air inlet and an air outlet opposite to the air inlet. The fan is located adjacent to the air inlet of the fan duct. The air outlet of the fan duct is oriented toward all of the CPUs, to guide airflow generated by the fan to reach the CPUs and cool the CPUs.

However, when one (or more) of the CPUs has been removed, a portion of the airflow still goes to an area where no CPU is located. Thus, such airflow is liable to be completely wasted. The other CPU (or CPUs) is not efficiently cooled by the available airflow in the fan duct.

It is desirable to provide an electronic device having means which can overcome the above-described limitations.

DETAILED DESCRIPTION

Figure 1:
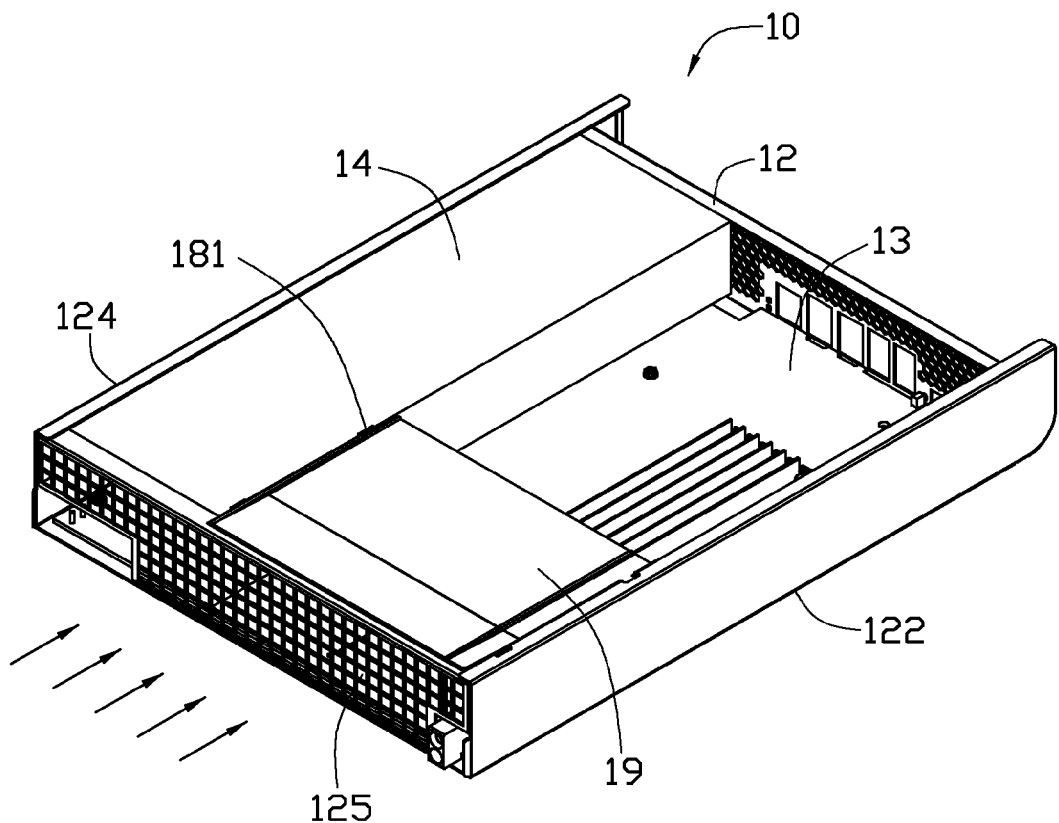
FIG. 1 is an assembled, isometric view of an electronic device in accordance with an exemplary embodiment, wherein the electronic device includes an air duct, but not showing a top cover of the electronic device.
Figure 2:
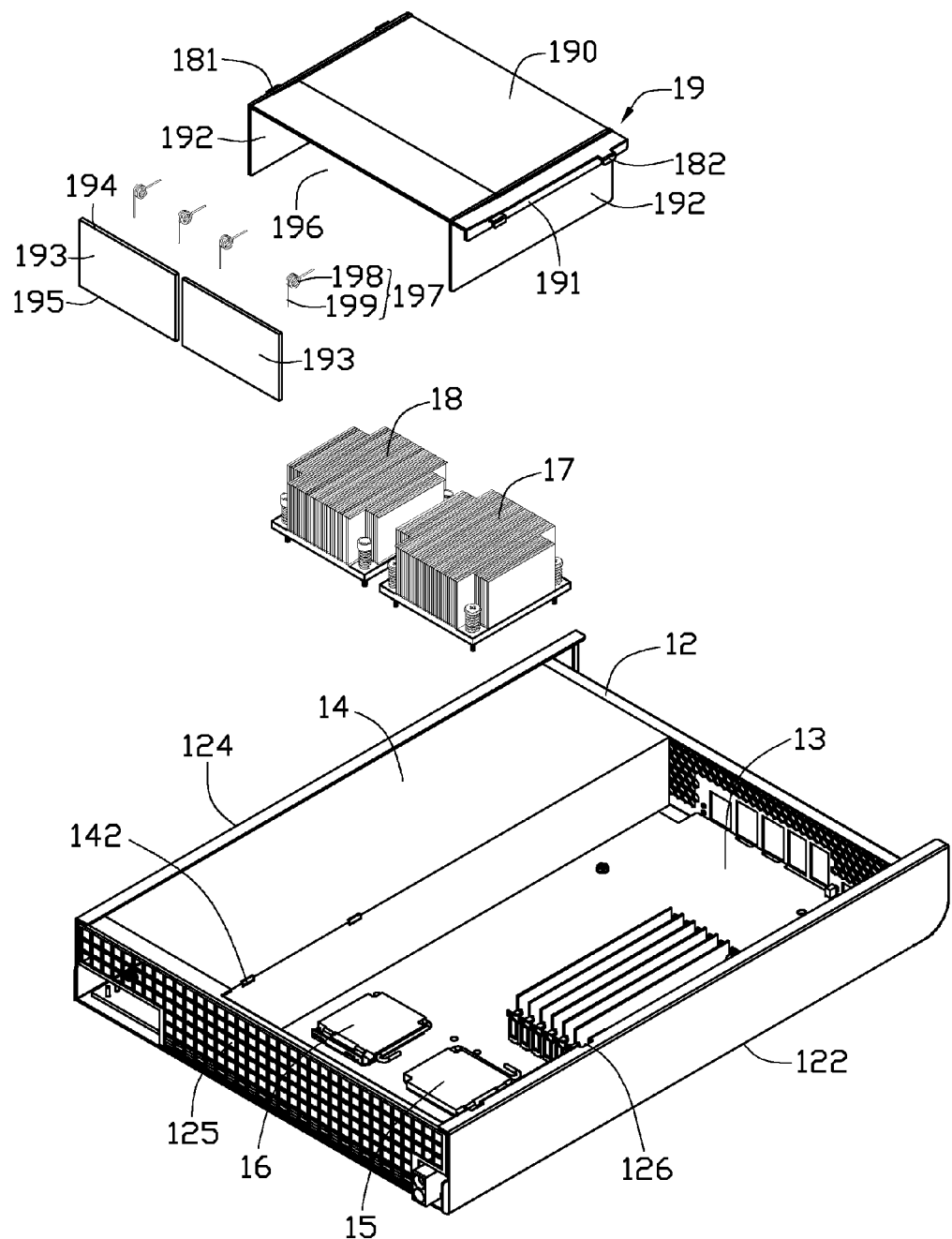
FIG. 2 is an exploded view of the electronic device of FIG. 1, wherein the electronic device further includes a first CPU and a second CPU mounted therein, and two heat sinks attached to the first CPU and the second CPU, respectively.

Referring to FIGS. 1 and 2, an electronic device 10 according to an exemplary embodiment of the disclosure is shown. The electronic device 10 includes an enclosure 12, a circuit board 13 received in the enclosure 12, a first CPU (Central Processing Unit) 15 and a second CPU 16 mounted on the circuit board 13, a first heat sink 17 and a second heat sink 18 for dissipating heat generated from the first CPU 15 and the second CPU 16, respectively, and an air duct 19 fixed to the enclosure 12 and located on the circuit board 13.

In the following description, the stated orientations of the elements of the electronic device 10 are with reference to the orientations of the elements as shown in FIG. 1.

The enclosure 12 includes a rectangular substrate 122, and four sidewalls 124 extending upwardly from four sides of the substrate 122, respectively. The substrate 122 and the sidewalls 124 cooperatively define a receiving room (not labeled) in the enclosure 12. The circuit board 13, the first and second CPUs 15, 16, the first and second heat sinks 17, 18, and the air duct 19 are received in the receiving room.

A front one of the sidewalls 124 defines a plurality of tiny ventilating holes 125 for allowing cooling air outside the server 10 to enter the enclosure 12 under an action of a cooling fan (not shown) installed in the enclosure 12 or an air conditioner (not shown) installed outside the enclosure 12. A right one of the sidewalls 124 defines two mounting holes 126 for fixing the air duct 19. A fixing member 14 with two spaced fixing holes 142 defined therein is connected with a left sidewall 124 of the enclosure 12.

The first CPU 15 and the second CPU 16 are located at a corner of the circuit board 13, adjacent to a portion of the ventilating holes 125 of the sidewall 124 of the enclosure 12. The first heat sink 17 and the second heat sink 18 are attached to the top of the first CPU 15 and the top of the second CPU 16, respectively, for dissipating heat therefrom.

Figure 3:
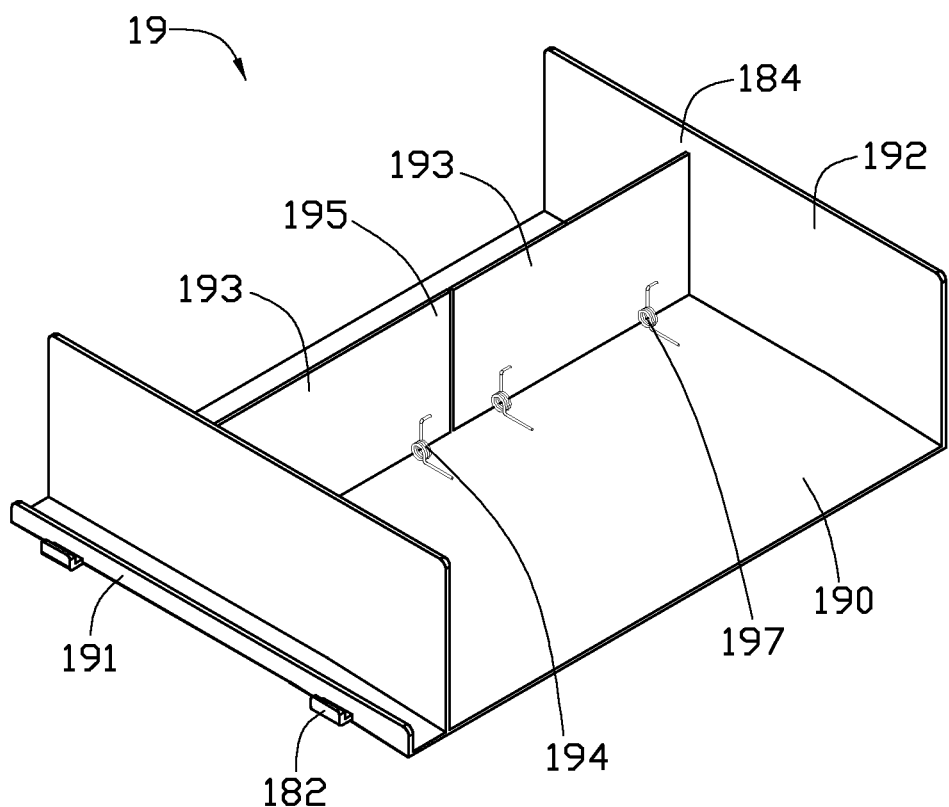
FIG. 3 is an isometric view of the air duct of the electronic device of FIG. 2, showing the air duct inverted.

Referring also to FIG. 3, the air duct 19 includes a top plate 190, two side plates 192 extending downwardly from two opposite lateral sides of the top plate 190, two baffle plates 193 extending downwardly from the top plate 190 and located between the side plates 192, and a plurality of torsion springs 197 connected between the baffle plates 193 and the top plate 190.

The top plate 190 of the air duct 19 is flat and rectangular in this embodiment. A width of the top plate 190 (as measured along a direction from one side plate 192 to the other side plate 192) is greater than a length of the top plate 190 (as measured along a direction of airflow in the air duct 19). One side plate 192 extends from a left lateral side of the top plate 190. The side plate 192 forms two spaced hooks 181 for engaging with the two fixing holes 142 of the enclosure 12. The other side plate 192 extends from a position adjacent to but spaced from a right lateral side of the top plate 190. The side plates 192 are the same as each other both in shape and in size. The top plate 190 and the side plates 192 cooperatively form a substantially U-shaped structure, and an air passage 196 is defined in the U-shaped structure.

A flange 191 extends downwardly from the right lateral side of the top plate 190. A height of the flange 191 along the vertical direction is much shorter than that of the side plates 192. Two spaced hooks 182 are formed on the flange 191, and are engagable in the mounting holes 126 of the enclosure 12.

The two baffle plates 193 in the air passage 196 are located substantially in the same plane and extend between the side plates 192. The baffle plates 193 are arranged closer to a front side of the top plate 190 than to a rear side of the top plate 190. Each baffle plate 193 is flat and rectangular, and includes a top end 194 abutting the top plate 190 and an opposite bottom end 195. A height of each baffle plate 193 along the vertical direction (i.e., from the top end 194 to the bottom end 195) is slightly shorter than that of each side plate 192 along the same direction. The top end 194 of the baffle plate 193 is pivotally connected with a bottom surface of the top plate 190 by two torsion springs 197, such that the baffle plate 193 is able to rotate relative to the top plate 190.

Each of the torsion springs 197 includes a main body 198, and two arms 199 extending from two opposite sides of the main body 198. In this embodiment, one arm 199 of the torsion spring 197 is linear, and the other arm 199 is L-shaped. The arms 199 of each torsion spring 197 are substantially perpendicular to each other when the torsion spring 197 is in a free state without deformation.

Each torsion spring 197 is fixed between the baffle plate 193 and the top plate 190, with one arm 199 abutting against the top plate 190 and the other arm 199 abutting against the top end 194 of the baffle plate 193. In this embodiment, the torsion spring 197 is fixed by soldering the arms 199 to the baffle plate 193 and the top plate 190, respectively. Further or alternatively, the main body 198 of the torsion spring 197 can be soldered on the top plate 190 and/or the baffle plate 193. When the torsion springs 197 are in their free state, the baffle plate 193 is perpendicular to the top plate 190. When the two baffle plates 193 are in their free states, they are substantially coplanar.

Figure 4:
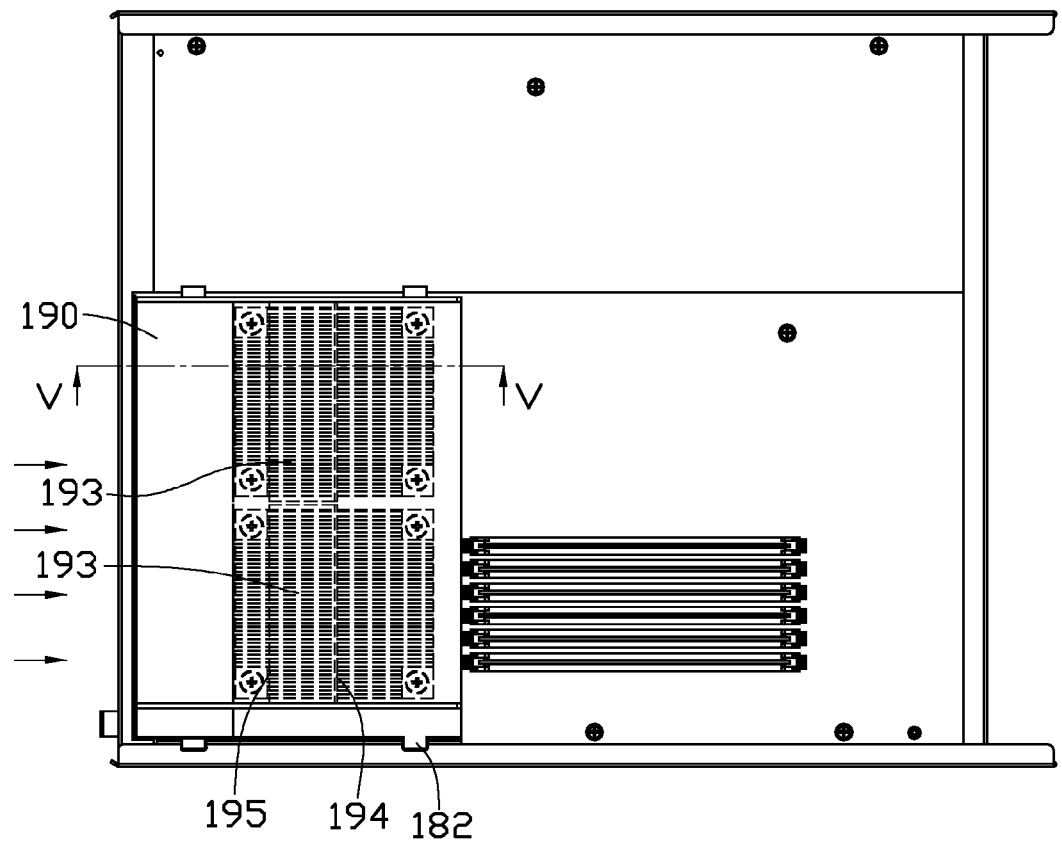
FIG. 4 is a top view of the electronic device of FIG. 1, showing the two heat sinks in phantom.
Figure 5:
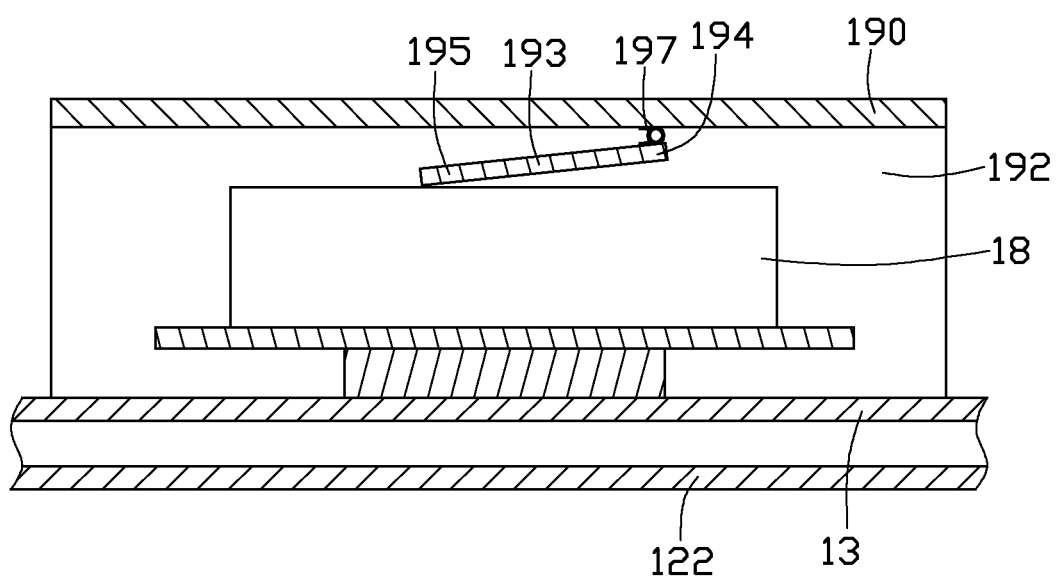
FIG. 5 is a cross section of the electronic device of FIG. 4, taken along line V-V thereof.

Referring also to FIGS. 4 and 5, during installation of the air duct 19, the air duct 19 is positioned above the first heat sink 17 and the second heat sink 18. The first and second heat sinks 17, 18 are aligned with the air passage 196 of the air duct 19, the hooks 181 are aligned with the fixing holes 142 of the enclosure 12, and the hooks 182 of the air duct 19 are aligned with the mounting holes 126 of the enclosure 12. The bottom ends 195 of the baffle plates 193 abut against the first heat sink 17 and the second heat sink 18, respectively. At this time, bottoms of the side plates 192 of the air duct 19 are spaced from the circuit board 13.

Then the air duct 19 is moved downwardly towards the circuit board 13. Under urging force applied by the first heat sink 17 and the second heat sink 18, the baffle plates 193 rotate relative to the top plate 190 with the bottom ends 194 moving towards the top plate 190, such that the first heat sink 17 and the second heat sink 18 are allowed to be received in the air passage 196.

When the bottoms of the side plates 192 of the air duct 19 reach and abut the circuit board 13, the hooks 181 of the air duct 19 are engaged in the fixing holes 142 of the enclosure 12, the hooks 182 of the air duct 19 are fittingly engaged in the mounting holes 126 of the enclosure 12, and the installation of the air duct 19 is finished. In such a state, the air duct 19 spans the first and second heat sinks 17, 18. The first and second CPUs 15, 16 and the first and second heat sinks 17, 18 are received in the air passage 196 of the air duct 19. Each baffle plate 193 is oriented slantwise relative to the top plate 190, with an acute angle formed between the baffle plate 193 and the top plate 190. Each torsion spring 197 is compressed between the top plate 190 and the corresponding baffle plate 193.

In operation, heat generated by the first CPU 15 and the second CPU 16 is absorbed by the first heat sink 17 and the second heat sink 18, respectively. Airflow freely flows through the air passage 196 of the air duct 19, and thereby cools the first heat sink 17 and the second heat sink 18. Thus, the first CPU 15 and the second CPU 16 are cooled and avoid overheating.

Figure 6:
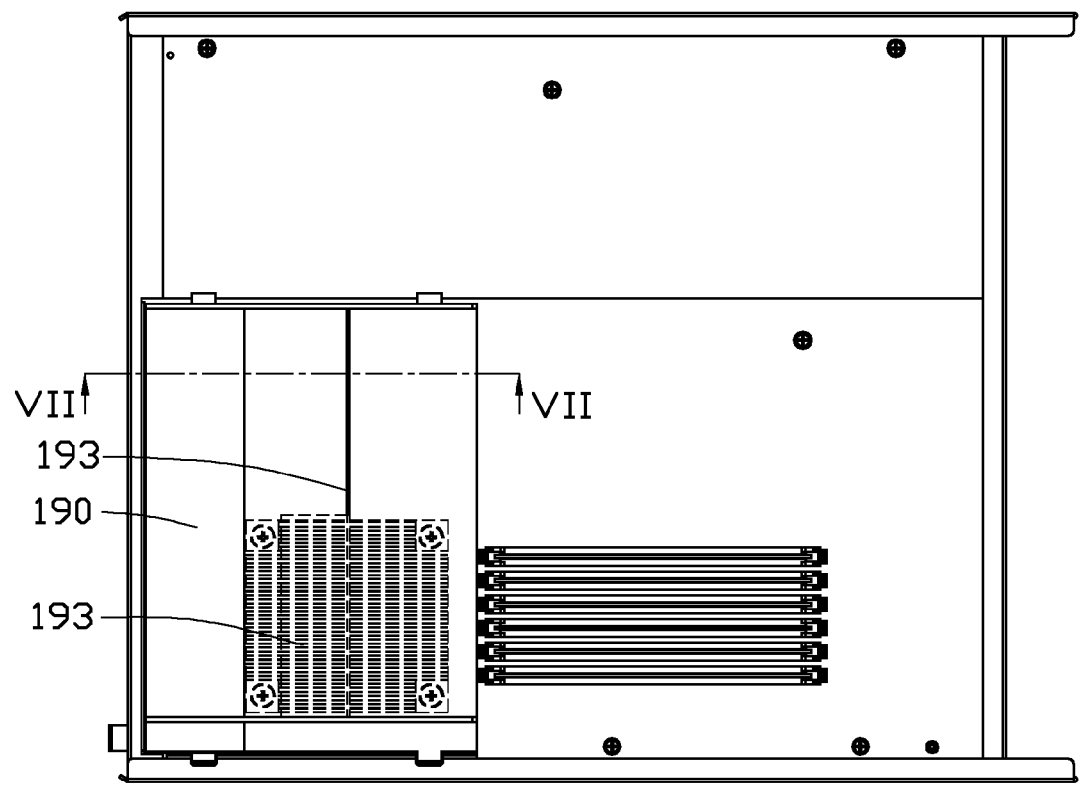
FIG. 6 is similar to FIG. 4, but with the second CPU and the heat sink for the second CPU removed.
Figure 7:
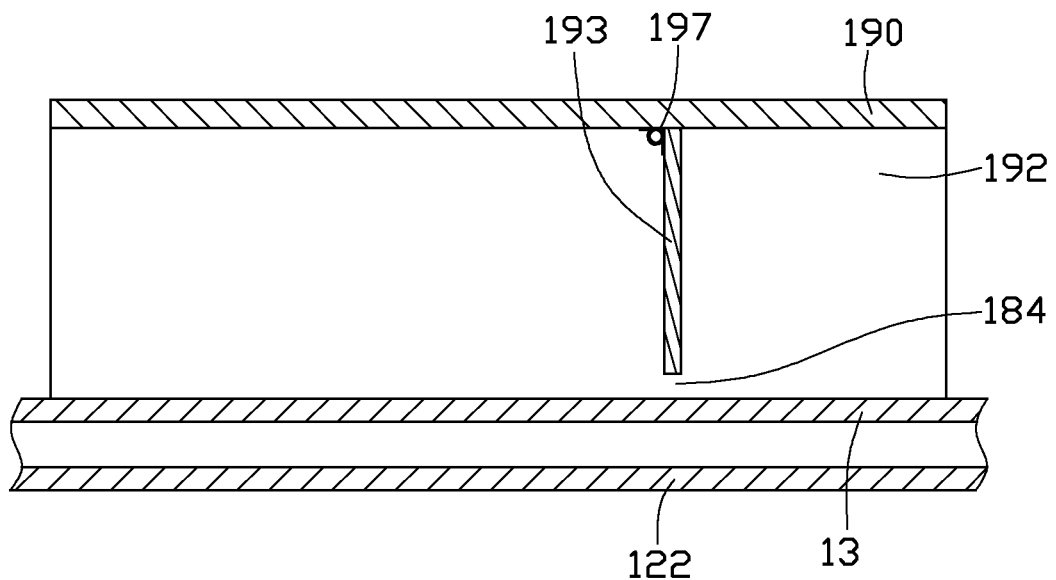
FIG. 7 is a cross section of the electronic device of FIG. 6, taken along line VII-VII thereof.

Referring to FIGS. 6 and 7, when the second CPU 16 is removed from the circuit board 13 and the air duct 19 is reinstalled, there is no urging force applied on the corresponding baffle plate 193. Thus, the corresponding torsion springs 197 keep their original states after the air duct 19 has been installed. At that time, the baffle plate 193 is perpendicular to the top plate 190. The baffle plate 193 extends towards the circuit board 13, and the bottom end 194 of the baffle plate 193 is adjacent to the circuit board 13. The bottom end 194 of the baffle plate 193 is spaced from the circuit board 13 with a gap 184 defined therebetween. The other baffle plate 193 corresponding to the first CPU 15 is rotated relative to the top plate 190 due to the urging force applied by the first heat sink 17 during and after installation of the air duct 19.

When the airflow proceeds along the air passage 196 of the air duct 19, the baffle plate 193 which is perpendicular to the top plate 190 baffles most of the airflow heading toward the side of the air duct 19 where the second CPU 16 was located, and directs such baffled airflow to flow to the first heat sink 17 and the first CPU 15. Due to the torsion springs 197 being resistant to compression, the baffle plate 193 is prevented from rotating towards the top plate 190 even though the airflow pushes on the baffle plate 193. That is, the baffle plate 193 is held in place despite being buffeted by the airflow.

Because the gap 184 is defined between the top surface of the circuit board 13 and the bottom end 194 of the baffle plate 193, part of the airflow that flows to the side of the air duct 19 where the second CPU 16 was located flows through the gap 184 and cools other electronic components (not shown) located outside of the air duct 13 downstream from where the second CPU 16 was located.

Alternatively, the first CPU 15 can be removed from the circuit board 13 instead of the second CPU 16. In such case, the baffle plate 193 corresponding to the first CPU 15 is oriented perpendicular to the top plate 190 to baffle airflow flowing to the side where the first CPU 15 was located.

It is to be understood, however, that even though numerous characteristics and advantages of certain embodiment(s) have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An electronic device, comprising:
   an enclosure, the enclosure defining a mounting hole therein;
   a circuit board received in the enclosure, the circuit board comprising a first area for mounting a first electronic component and a first heat sink on the first electronic component, and a second area for mounting a second electronic component and a second heat sink on the second electronic component; and
   an air duct mounted in the enclosure, the air duct covering the first area and the second area of the circuit board, the air duct comprising:
      a top plate;
      two side plates, one of the side plates extending from one lateral side of the top plate, the other side plate extending from a position adjacent to but spaced from an opposite lateral side of the top plate, the side plates and the top plate cooperatively forming a substantially U-shaped structure and defining an air passage in the air duct, wherein the first area and the second area of the circuit board are located in the air passage;
      a flange extending from the opposite lateral side of the top plate, a hook being formed on the flange, the hook engagable in the mounting hole of the enclosure;
      a baffle plate extending from the top plate and located between the side plates, the baffle plate aligned with the second area, the baffle plate comprising a first end pivotally connected with the top plate and an opposite second end, the baffle plate thereby being rotatable relative to the top plate; and
      a torsion spring connected between the top plate and the baffle plate, the torsion spring comprising two arms abutting against the top plate and the baffle plate, respectively;

wherein when the first electronic component with the first heat sink attached thereon and the second electronic component with the second heat sink attached thereon are both mounted on the circuit board, the baffle plate is rotated towards the top plate and the torsion spring is compressed, and the second end of the baffle plate abuts against a top of the second heat sink, such that air flowing through the air duct is able to pass over both the first electronic component and the second electronic component; and when the second electronic component and the second heat sink are absent and only the first electronic component with the first heat sink attached thereon is mounted on the circuit board, the baffle plate is located approximately perpendicular to the top plate with the second end of the baffle plate adjacent to the circuit board, such that the baffle plate baffles air flowing through the air duct at the location of the missing second electronic component and redirects at least part of such air to flow toward the first electronic component.

2. The electronic device of claim 1, wherein the arms of the torsion spring are soldered to the top plate and the baffle plate, respectively.

3. The electronic device of claim 1, wherein the two arms of the torsion spring are perpendicular to each other.

4. The electronic device of claim 1, wherein the air duct further comprises another torsion spring connected between the baffle plate and the top plate.

5. The electronic device of claim 4, wherein the air duct further comprises another baffle plate aligned with the first area of the circuit board and another two torsion springs connected between the another baffle plate and the top plate.

6. The electronic device of claim 5, wherein when the torsion springs are in their free state, the baffle plate and the another baffle plate are substantially coplanar.

7. The electronic device of claim 1, wherein a height of the baffle plate along a direction away from the top plate is shorter than that of each of the side plates.

8. The electronic device of claim 1, wherein when the torsion spring is in its free state, the second end of the baffle plate is spaced from the circuit board with a gap defined therebetween.

* * * * *